United States Patent
Haines

(10) Patent No.: US 7,916,537 B2
(45) Date of Patent: Mar. 29, 2011

(54) MULTILEVEL CELL MEMORY DEVICES HAVING REFERENCE POINT CELLS

(75) Inventor: Jonathan Williams Haines, Boulder, CO (US)

(73) Assignee: Seagate Technology LLC, Scotts Valley, CA (US)

(*) Notice: Subject to any disclaimer, the term of this patent is extended or adjusted under 35 U.S.C. 154(b) by 64 days.

(21) Appl. No.: 12/483,038

(22) Filed: Jun. 11, 2009

(65) Prior Publication Data

US 2010/0315872 A1  Dec. 16, 2010

(51) Int. Cl.
*G11C 16/00* (2006.01)
(52) U.S. Cl. .............. 365/185.03; 365/185.2; 365/210.1
(58) Field of Classification Search .................. None
See application file for complete search history.

(56) References Cited

U.S. PATENT DOCUMENTS

| | | | |
|---|---|---|---|
| 4,604,732 A * | 8/1986 | van Tran | 365/207 |
| 5,477,485 A | 12/1995 | Bergemont et al. | |
| 5,539,690 A | 7/1996 | Talreja et al. | |
| 5,594,697 A * | 1/1997 | Hirano et al. | 365/185.03 |
| 5,748,546 A * | 5/1998 | Bauer et al. | 365/210.12 |
| 5,790,453 A * | 8/1998 | Chevallier | 365/185.03 |
| 5,936,906 A * | 8/1999 | Tsen | 365/210.13 |
| 6,133,098 A | 10/2000 | Ogura et al. | |
| 6,275,417 B1 | 8/2001 | Lee et al. | |
| 6,459,613 B1 * | 10/2002 | Lin et al. | 365/185.21 |
| 6,538,923 B1 | 3/2003 | Parker | |
| 6,618,297 B1 * | 9/2003 | Manea | 365/189.09 |
| 6,707,742 B2 * | 3/2004 | Kamei et al. | 365/210.1 |
| 6,836,431 B2 | 12/2004 | Chang | |
| 6,839,279 B2 * | 1/2005 | Yamada | 365/185.2 |
| 7,333,368 B2 * | 2/2008 | Mukunoki | 365/185.24 |
| 7,369,441 B2 * | 5/2008 | Huang | 365/185.21 |
| 7,385,848 B2 * | 6/2008 | Iwata et al. | 365/185.21 |
| 7,830,705 B2 * | 11/2010 | Jeong | 365/163 |

* cited by examiner

*Primary Examiner* — Tan T. Nguyen
(74) *Attorney, Agent, or Firm* — David D. Brush; Westman, Champlin & Kelly, P.A.

(57) ABSTRACT

Embodiments of the disclosure include multilevel memory cell devices that utilize reference point cells to determine the states of other cells. Embodiments of the disclosure also include methods of storing data to and retrieving data from multilevel memory cell devices utilizing reference point cells. In one embodiment, a multilevel memory cell device includes user data cells, a reference point cell, and a controller. The user data cells each has one of a plurality of states. The reference point cell has a first state. The controller determines the states of the user data cells based at least in part on the first state of the reference point cell.

19 Claims, 6 Drawing Sheets

MULTILEVEL CELL MEMORY DEVICES HAVING REFERENCE POINT CELLS

BACKGROUND

Memory devices commonly store and retrieve information by manipulating characteristics of their cells. For example, chalcogenide glass phase-change memory utilizes thermal energy to switch the chalcogenide glass between amorphous and crystalline states. The amorphous and crystalline states have different electrical resistivities. Accordingly, information is stored or encoded to the chalcogenide glass phase-change memory by altering the state of the cells, and information is retrieved or decoded by determining the resitivities or resistances of the cells (e.g. by applying a voltage to the cells and measuring the resulting electrical current).

Different types of memory device cells store different amounts of information. Single level memory cell devices store one bit of information per a cell by varying between two states. For example, a single level flash memory cell has a floating gate that is capable of holding an electric charge. A cell having a charged floating gate illustratively represents a binary "0," and a cell having an un-charged floating gate illustratively represents a binary "1."

Multilevel memory cell devices store more than one bit of information per a cell by varying between three or more states. For example, a multilevel flash memory cell illustratively stores varying amounts electrical charge to its floating gate. The highest charged floating gate state may represent a binary "00," and the lowest charged floating gate state may represent a binary "11." Floating gate charges between the highest and lowest values illustratively represent a binary "01" and "10."

Memory devices commonly have data retention issues. For example, properties of flash memory cells may change based on the number of write and erase cycles performed on the cells. One such illustrative property is the ability of the cells to be charged and to retain a charge. These changes may cause data to be incorrectly written to a cell or for a cell to lose data once it has been written.

SUMMARY

An aspect of the disclosure relates to multilevel memory cell devices that utilize reference point cells to determine the states of other cells.

Another aspect of the disclosure relates to a method of storing data to and retrieving data from multilevel memory cell devices utilizing reference point cells.

In one particular embodiment, a multilevel memory cell device includes user data cells, a reference point cell, and a controller. Each user data cell has one of a plurality of states. The reference point cell has a first state. The controller determines the states of the user data cells based at least in part on the first state of the reference point cell.

BRIEF DESCRIPTION OF THE DRAWINGS

FIG. 3-1 is a schematic diagram of an electronic device communicatively coupled to a multilevel cell memory device.

FIG. 3-2 is a schematic diagram of an electronic device having integrated multilevel cell memory.

DETAILED DESCRIPTION

Multilevel cell ("MLC") memory devices commonly use fixed reference voltages to decode information stored in cells. For instance, a MLC flash memory device may interpret a cell having a floating gate voltage of 1.0 volts as representing a binary "11," a cell having a floating gate voltage of 2.0 volts as representing a binary "10," a cell having a floating gate voltage of 3.0 volts as representing a binary "01," and a cell having a floating gate voltage of 4.0 volts as representing a binary "00."

This use of fixed reference voltages may lead to data loss or corruption. For example, a flash memory cell may lose charge over time. The loss of charge may be significant enough for the cell to be decoded incorrectly (e.g. interpreted as representing a value associated with a lower charge). Also for example, the ability of a MLC flash memory cell to be charged may deteriorate over time or based on the number of write and erase cycles. A cell that is intended to have a charge of 4.0 volts may only be able to be charged to 3.0 volts. When data from the cell is retrieved, it will be decoded or interpreted as representing the value associated with 3.0 volts instead of the value associated with the intended 4.0 volts.

At least one example of the present disclosure illustratively does not use fixed reference points. Instead, as will be described in much greater detail below, variable reference points are used. For instance, in one embodiment, one or more cells in a device are used as reference cells. The information or data stored in the other cells in the device are illustratively decoded based upon the states of the reference cells. In this manner, changes to properties of cells, such as but not limited to, the ability to be charged or hold a charge, are accounted for in the decoding process.

Figure 1:
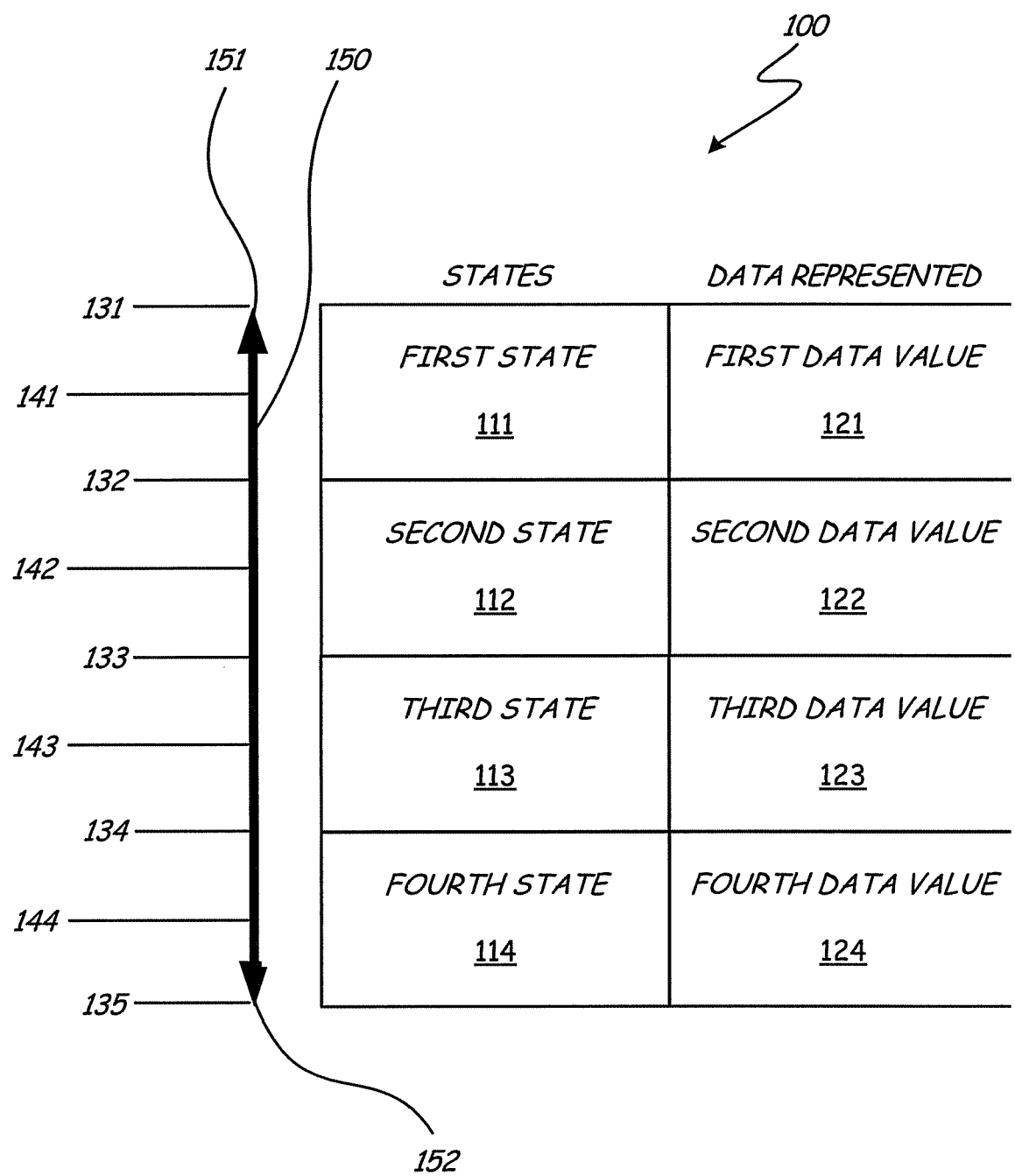
FIG. 1 is a schematic diagram of a decoding chart for a multilevel cell memory device.

FIG. 1 is a schematic diagram of a decoding chart 100 for a multilevel cell memory device. In chart 100, the multilevel cell has four possible states, 111, 112, 113, and 114. Embodiments of the present disclosure are not however limited to cells having four states. Embodiments include cells having any number of states (e.g. 2, 3, 4, 5, 6, etc.).

The states correspond to a property or characteristic of the cell. For example, in a flash memory cell, the floating gate charge or voltage is illustratively increased or decreased to vary the state of a cell. In an embodiment, the four states 111-114 each correspond to a different floating gate charge. In a chalcogenide glass phase-change memory cell, the electrical resistivity of the chalcogenide glass is varied by changing the glass between different states of being amorphous or crystalline. In an embodiment, the four states 111-114 each correspond to a different glass resistivity value. Embodiments of the present disclosure are not however limited to flash memory cells or phase-change memory cells. Embodiments include any type or types of memory cells that manipulate the states of the cells using any property or characteristic. For example, for illustration purposes only and not by limitation, embodiments include cells that vary states by manipulating or changing a voltage, a resistivity, a resistance, a capacitance, an electric current, an optical property, a thermal property, and/or a magnetic property.

Each state 111-114 is associated with and corresponds to a data value 121-124. FIG. 1 shows that the first state 111 corresponds to the first data value 121, that the second state 112 corresponds to the second data value 122, that the third state 113 corresponds the third data value 123, and that the fourth state 114 corresponds to the fourth data value 124. Data values 121-124 are illustratively different binary values such as, but not limited to, "00," "01," "10," and "11." In another embodiment, data values 121-124 are Gray-coded such that two successive states differ by only one bit. For example, for cells having four states, the states illustratively correspond to "00," "01," "11," and "10," respectively. Data values 121-124 are not however limited to any specific values.

FIG. 1 includes a line 150 that represents a spectrum or range of a cell property that is used in determining a memory cell state. The cell property illustratively continuously or discretely changes or varies between the top of the line 151 and the bottom of the line 152. For example, the cell property is illustratively a voltage or a resistivity, and the voltage or resistivity either increases or decreases continuously going from top 151 to bottom 152.

FIG. 1 also includes a set of boundary or border reference points (first boundary reference point 131, second boundary reference point 132, third boundary reference point 133, fourth boundary reference point 134, and fifth reference boundary point 135) and a set of center or mean reference points (first center reference point 141, second center reference point 142, third center reference point 143, and fourth center reference point 144). The reference points are illustratively used in decoding data or information stored in a multilevel cell based on the state of the cell. For example, in an embodiment in which voltage is used to alter the state of a cell, boundary reference points 131-135 represent different voltage values, and the state of the cell is determined by comparing the voltage of the cell to the reference points 131-135. For instance, if the voltage of the cell is between the first boundary reference point 131 and the second boundary point 132, the cell is determined as corresponding to the first state 111. Similarly, if the voltage is between the second boundary reference point 132 and the third boundary reference point 133, the cell is determined as corresponding to the second state 112. This process is illustratively continued for the other boundary reference points (i.e. between points 133 and 134 corresponds to third state 113, and between points 134 and 135 corresponds to fourth state 114).

Alternatively, in another embodiment, the center or mean reference points 141-144 are used instead of or in addition to the boundary reference points 131-135. Each of the center reference points 141-144 corresponds to one of the states 111-114 (e.g. point 141 corresponds to state 111, point 142 corresponds to state 112, point 143 corresponds to state 113, and point 144 corresponds to state 114). A property or characteristic of a cell is illustratively compared to one or more of the center reference points 141-144. The cell is interpreted or decoded as corresponding to the state associated with the center reference point 141-144 that the cell property or characteristic is closest to. For example, again using voltage as the cell property, if center point 141 is 1.0 volts, center point 142 is 2.0 volts, center point 143 is 3.0 volts, and center point 144 is 4.0 volts, a cell having a voltage of 1.2 volts is decoded as corresponding to the first state 111, and a cell having a voltage of 3.9 volts is decoded as corresponding to the fourth state 114.

Figure 2:
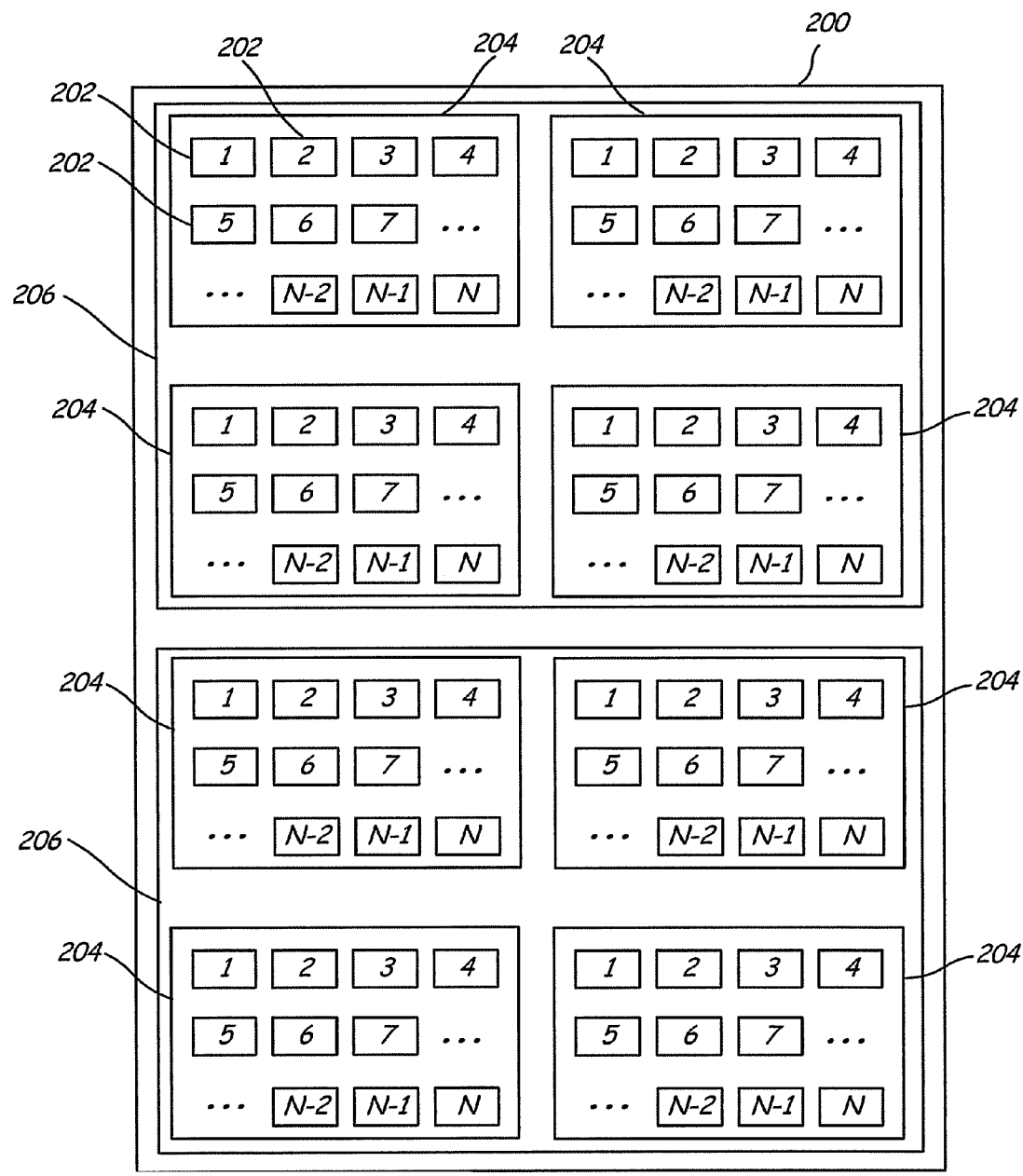
FIG. 2 is a schematic diagram of a configuration or arrangement of multilevel memory cells in a memory device.

FIG. 2 is a schematic diagram of a configuration or arrangement of multilevel memory cells in a memory device 200. Device 200 includes a plurality of multilevel memory cells 202 (three are labeled in FIG. 2). Cells 202 are grouped into pages 204. Each page 204 includes N number of cells 202, where N is any number (e.g. 512, 1,024, 2,112, 4,096, 4,224, 8,192, etc.). Pages 204 are grouped into blocks 206. FIG. 2 shows each block 206 having four pages 204. Embodiments of blocks 206 include any number of pages, such as but not limited to, 32, 64, or 128 pages. FIG. 2 shows that device 200 includes two blocks 206. Embodiments of multilevel cell memory device 200 include any number of blocks.

The configuration or arrangement of cells into pages, and pages into blocks shown in FIG. 2 is for illustration purposes only. Embodiments of the present disclosure include any type of configuration or arrangement of cells. For example, in an embodiment, all the cells in a device are in one group having N cells. In another embodiment, cells are arranged into multiple groups each having N cells, however those groups are not further grouped (e.g. they are not grouped into blocks).

Figures 1, 3:
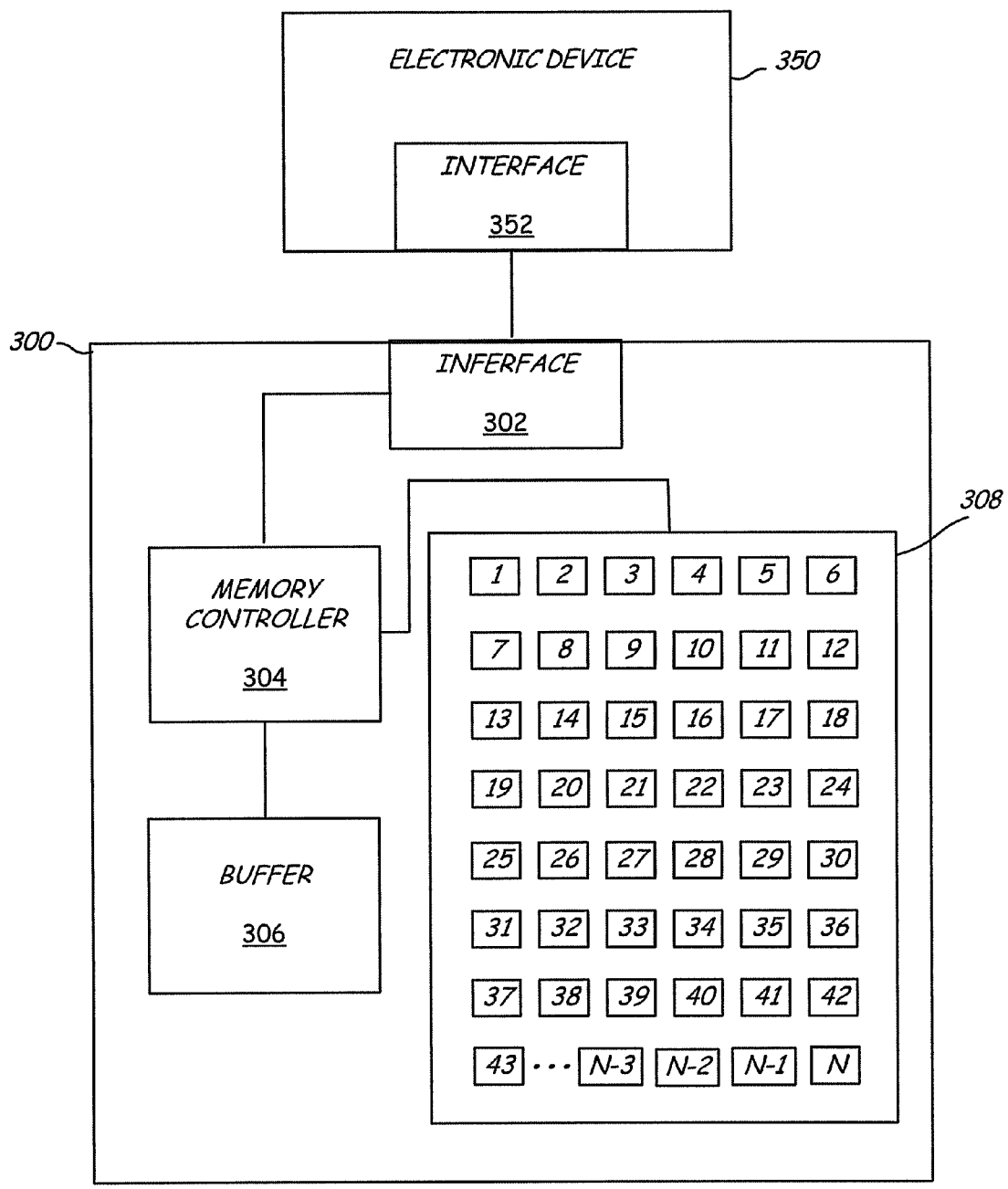
Figures 2, 3:
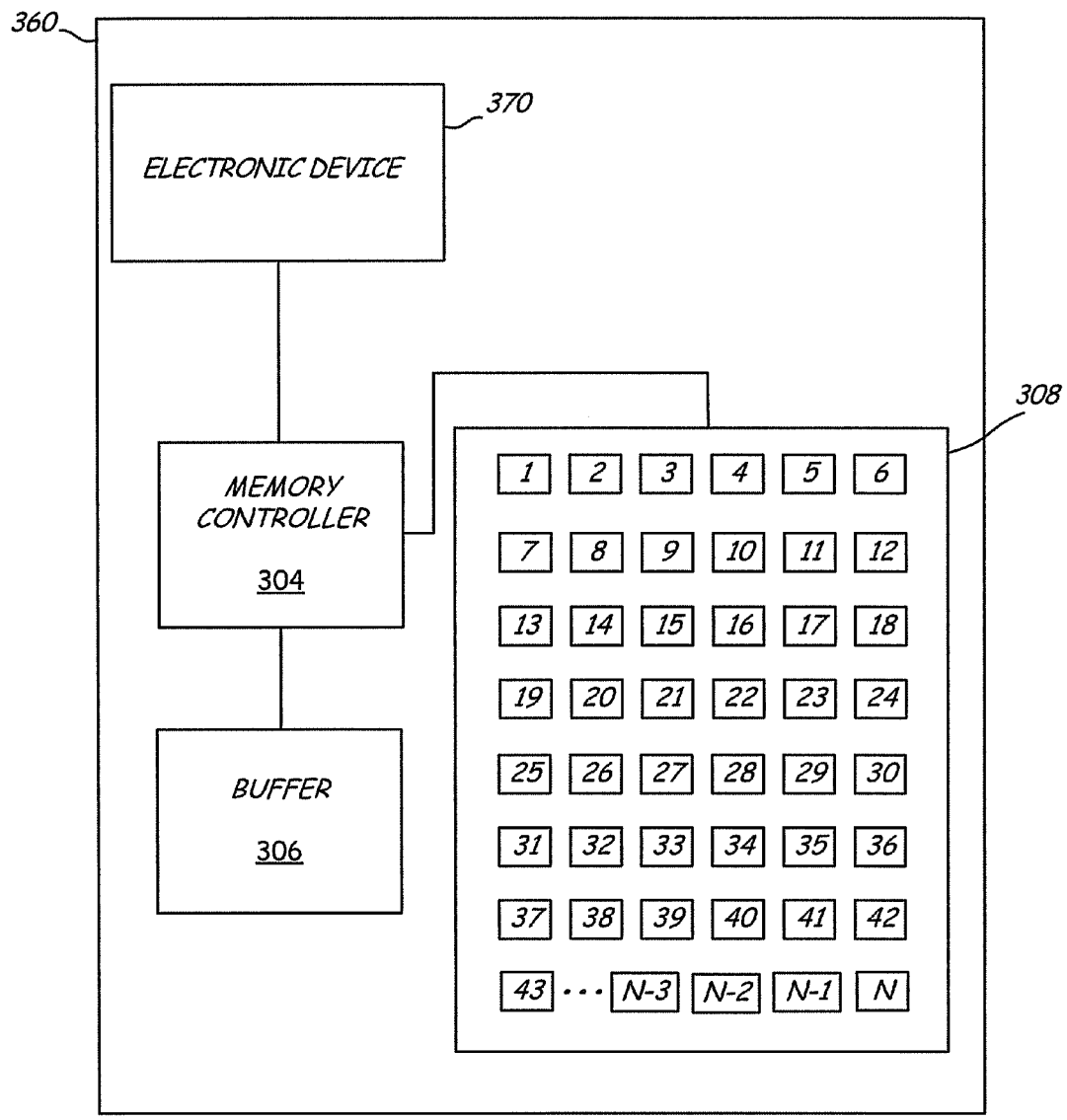

FIGS. 3-1 and 3-2 are illustrative operating environments in which certain embodiments disclosed herein may be incorporated. The operating environments shown in the figures are for illustration purposes only. Embodiments of the present disclosure are not limited to any particular operating environment such as those shown in FIGS. 3-1 and 3-2.

FIG. 3-1 is a schematic diagram of a multilevel cell memory device 300 communicatively coupled to a separate electronic device 350. Device 300 illustratively includes an interface 302, a controller 304, a buffer 306, and a group of or array of multilevel memory cells 308. FIG. 3-1 shows one array of memory cells having N cells. Embodiments include any number of cells per an array and any number of arrays. It is also worth pointing out that in one embodiment, that each array has the same number of cells and that in another embodiment, that one or more arrays have different numbers of cells. Interface 302 is illustratively coupled to an interface 352 of electronic device 350 such that information or data can be exchanged or sent back and forth between electronic device 350 and MLC memory device 300. Electronic device 350 includes any electronic device such as, but not limited to, a personal computer, a cell phone, a camera, a music player, a gaming device, or a personal digital assistant.

Controller 304 illustratively controls or manages the storing or encoding of data to array 308 and the retrieval or decoding of data from array 308. Controller 304 optionally uses a buffer memory 306 in storing or retrieving information from array 308. For example, controller 304 is illustratively configured to write to a specific number of multilevel memory cells at a time. In such a case, controller 304 stores data to buffer 306 until the appropriate amount of data is accumulated, and controller 304 then transfers data from buffer 306 to array 308.

FIG. 3-2 is a schematic diagram of an electronic device 370 having integrated multilevel cell memory. The environment shown in FIG. 3-2 has many of the same or similar components as the environment shown in FIG. 3-1 such as memory controller 304, buffer 306, and array 308. The environment shown in FIG. 3-2 however differs from that in FIG. 3-1 in that the electronic components are integrated onto one printed circuit board 360. In such a case, electronic device 370 is illustratively communicatively coupled directly to memory controller 304 instead of through one or more interfaces such as those shown in FIG. 3-1.

As was previously mentioned, FIGS. 3-1 and 3-2 are merely illustrative operating environments. Embodiments of the present disclosure are illustratively practiced within any number of different types of operating environments. For example, in one embodiment of a MLC memory device, the device does not include a controller or a buffer. Instead, the encoding and decoding of information to and from the multilevel memory cell array are performed or managed by an external device. In another embodiment, the components of a MLC memory device are comprised in one physical unit (e.g. one piece of silicon or one printed circuit board). In yet another embodiment, the components are comprised in separate physical units (e.g. multiple pieces of silicon or multiple printed circuit boards).

In an embodiment, an array or group of multilevel memory cells, such as array 308 in FIGS. 3-1 and 3-2 or page 204 in FIG. 2, includes cells that are used as reference point cells and cells that are used to store user data (e.g. data that a user intends to store to and/or retrieve from a MLC memory device, error correction code data, mapping/addressing data, etc.). Reference point cells illustratively have a known or presumed state. In one embodiment, for multilevel cells having K possible states, where K is any number, there are K reference point cells that each represents or corresponds to one of the K states. For example, for cells having four possible states such as is shown in FIG. 1, four cells are used as reference cells and each of the four cells corresponds to a different one of the four possible states. In another embodiment, only two reference point cells are used and they correspond to the highest or maximum state (e.g. state 111 in FIG. 1) and the minimum or lowest state (e.g. state 114 in FIG. 1). Also, any number of reference point cells can be used for each state.

The reference point cells are illustratively used in determining or interpreting the data stored in the other cells. For example, a property or characteristic (e.g. voltage or resistivity) is measured or otherwise determined for a reference cell having a known or presumed state (e.g. the highest or maximum state). The same property or characteristic is similarly measured or otherwise determined for the cells used to store the user data. The user data cells that have the same or approximately same value for the characteristic or property as the reference cell are interpreted as corresponding to the same state (e.g. the highest or maximum state). For instance, a reference cell that corresponds to the highest state has a measured voltage of 5 volts. User data cells that are measured to have a voltage of 5 volts or approximately 5 volts are interpreted as also corresponding to the highest state.

In another embodiment, the reference cell or cells are used to determine a gain value (or more simply "a gain") that is used in determining the data stored in the other cells. For example, in one embodiment, the reference cells include a minimum state and a maximum state, and the range (e.g. voltage, resistivity, etc.) between the minimum and maximum states of the reference cells is used to determine the gain. For instance, in a simplified case for illustration purposes only and not by limitation, a system reads an analog electric current signal and converts the signal to digital information. The system expects a range from 1 milliamp to 11 milliamps. The reference point cells indicate that the actual range is from 0.5 milliamps to 5.5 milliamps. The gain for the system is calculated as being the expected range divided by the actual range, which in this case is 2 (i.e. 10 milliamps/5 milliamps). When the system receives a current from or corresponding to cells that store user data, the system multiplies the current by the gain and converts the resulting adjusted currents to digital information (i.e. the originally stored user data).

In another embodiment, the reference cell or cells are used to determine an offset value (or more simply "an offset"). Again, using a simplified situation for illustration purposes, a system expects a range from 1 milliamp to 11 milliamps. The reference point cells indicate that the actual range is from 0.5 milliamps to 10.5 milliamps. In this case, the gain is correct (i.e. the expected range and the range indicated by the reference point cells is the same). However, the reference cells indicate that the entire range between the states has drifted downward by 0.5 milliamps. In this simplified case, the offset can be calculated by finding the difference between the center value of the expected range (i.e. (1.0+11)/2=6) and the center value of the reference point cells (i.e. (0.5+10.5)/2=5.5), which is 0.5 (i.e. 6−5.5=0.5). When the system receives a current from or corresponding to cells that store user data, the system offsets or adds 0.5 and converts the adjusted currents to digital information.

Alternatively, instead of only determining and using only one calculated value (e.g. one gain, offset, histogram, boundary reference point, center reference point, etc.), more than one calculated value are illustratively determined and used (e.g. both a gain and offset are calculated and used, etc.). In one particular embodiment, an affine transformation is used in modeling and determining multiple calculated values (e.g. multiple gains and/or offsets). Additionally, instead of only measuring or determining properties of reference cells having minimum and/or maximum states, properties of reference cells having intermediary states are also measured or determined. These measurements are illustratively used in calculating a gain or offset such as those previously described. The intermediary states are also illustratively used to generate a more complex model. For instance, one or more reference point cells having intermediate states are optionally used to generate higher order polynomial models (e.g. a 2nd order, 3rd order, or higher polynomial model). The intermediate states are also optionally used to generate a non-linear equation or an empirical equation/model.

In yet another embodiment, multiple reference cells that each correspond to the same state are included in a MLC memory device and are collectively used in determining the states of the other cells. For example, property or characteristic statistics are calculated for the group of reference cells, and the user data is interpreted utilizing the statistics. Illustrative statistics include a mean, a median, a variance, a standard deviation, a range, and/or constructing a histogram. In one embodiment, a histogram is constructed for one or more groups of reference point cells that each has the same state. This histogram is then compared to an expected histogram for the state. The differences between the reference point cells histogram and the expected histogram is illustratively used to compensate for non-linear drift. Alternatively, the statistics (i.e. the mean, median variance, standard deviation, range, and/or histograms) are illustratively used in determining or calculating center reference points or border reference points such as those shown in FIG. 1. The user data cells are then compared to the calculated reference points to determine the states of the cells.

Reference cells are illustratively different cells than the cells used to store user data. However, in certain other embodiments, one or more cells act both to store user data and to store reference cell data or information. Embodiments in which different or separate cells are used will be discussed first.

In one embodiment, for every N cells, where N is any number, one or more of the cells are reference point cells and the remaining cells store user data. The reference point cells are illustratively at any relative position with respect to their associated user data cells. For example, MLC memory devices commonly read information from N cells in a particular sequential order. The reference cells are illustratively located such that they are read before, after, or between the reading of associated user data cells. Also, it is common for N cells in MLC memory devices to be arranged in columns and rows such as is shown in FIGS. 2, 3-1, and 3-2. The reference point cells illustratively are located at any positioning within an arrangement of columns and rows. In one embodiment, reference cells are surrounded by other cells (i.e. the cells are not located at an outer row or column). In another embodiment, reference cells are located at multiple physical locations relative to the user data cells.

The states of the reference cells are optionally based upon or depend upon the states of their associated user data cells. For instance, in a case of N cells, where the last two cells, N−1 and N are reference cells, if none of the user data cells (i.e. cells 1, 2, 3, ... N−3, and N−2) have a maximum or minimum state, then one of the last two reference cells has the maximum state and the other of the two has the minimum state. The order of the two states is illustratively based on the state of the preceding N−2 cell. If the state of the N−2 cell is closer to the minimum state, the N−1 reference point cell has the minimum state, and the N reference point cell has the maximum state. If the state of the N−2 cell is closer to the maximum state, the N−1 reference point cell has the maximum state, and the N reference point cell has the minimum state.

In another embodiment, if the user data cells include one or more cells having a minimum state only and no maximum state, then the one or more of the user data cells that has a minimum state is used as a reference cell point for the minimum state, and one of the reference point cells includes a maximum state. It is worth noting that in this scenario, a cell is being used both as a user data cell (i.e. to store user data) and as a reference cell (i.e. used to determine the states of user data cells). Similarly, if the user data cells include one or more cells having a maximum state only and no minimum state, then one or more of the user data cells that has a maximum state is used as a reference cell point for the maximum state, and one of the reference point cells includes a minimum state.

In yet another embodiment, if the user data cells include one or more cells that has a minimum state, and one or more cells that has a maximum state, then the one or more cells having a minimum state are used as a reference point cell for the minimum state, and the one or more cells having a maximum state are used as a reference point cell for the maximum state. It is worth noting that in this scenario, there need not be any cells that are exclusively reference cells. All of the reference information needed to determine the states of the user data cells is obtainable from the user data cells themselves. For example, the user data cells are illustratively encoded utilizing a low density parity code (e.g. a Gallager code) that is known to encode data such that one or more of the cells will have a minimum state and/or one or more cells will have a maximum state. In such a case, the known states that are included within the encoding scheme are utilized to generate the reference point cell information, and no extra cells (i.e. cells used exclusively as reference point cells) are needed.

As has been discussed, MLC memory devices illustratively have a plurality of arrays or other groupings of memory cells. In one embodiment, each of the groupings has the same number of cells and optionally has the same number of both reference point cells and user data cells. In another embodiment, one or more groupings of cells has a different number of total cells, reference point cells, and/or user data cells.

It is also worth pointing out that in order to implement certain of the embodiments described above, that the MLC memory device needs to know or be able to determine if a maximum state, minimum state, or both are included in the user data cells. In an embodiment, the user data is encoded using an algorithm or other method (e.g. a low parity density code) that ensures that one or more states are included in the user data cells (e.g. a minimum state, a maximum state, or both). The MLC memory device is optionally either aware of the states included in the user data cells (e.g. the MLC memory device has firmware that assumes the user data cells have one or more states) or the MLC memory device is able to determine the states included in the user data cells (e.g. by retrieving information indicative of the method used to encode the user data). In another embodiment, the MLC memory device is aware of or is able to determine the number of potential memory cell states (e.g. four states), and the memory device samples the cells. If all of the potential states are identified as being included in the memory cells (e.g. four sufficiently different states are identified by user configured thresholds or algorithms), then the MLC memory device illustratively uses the one or more cells corresponding to the maximum and minimum states as reference point cells.

Certain embodiments of the present disclosure include or utilize error correction code methods, error detection code methods, or both. In these methods, some redundant data is included in the data stored in the memory cells (i.e. either in the user data cells, reference point cells, or both) that is used to detect errors and/or correct errors. For example, in one embodiment, raw user data is encoded and decoded utilizing Trellis encoding/decoding. Trellis encoding/decoding illustratively includes sequences that include a maximum state, a minimum state, or both. Accordingly, the maximum, minimum, and/or both states included in the Trellis encoded user data is optionally used as reference point cells. One or more Trellis encoding/decoding methods or techniques are illustratively chosen that includes more than one maximum states and/or more than one minimum states, and each of the one or more states are used as reference cell points. Alternatively, a subset of the one or more states is used as reference cell points.

Embodiments also optionally include parity data in one or more cells, such as but not limited to, in one or more of the reference point cells. User data is illustratively encoded into groups of bits (e.g. 8 bits). Each of the groups has more significant bits and less significant bits. The less significant bits represent the smaller incremental changes in the number represented by the groups of bits. For example, the least significant bit in a number determines whether a number is odd or even. In an embodiment, a certain number, M, of the less significant bits for each group is selected, and the M bits for each of the groups are used to calculate a parity value.

Figure 4:
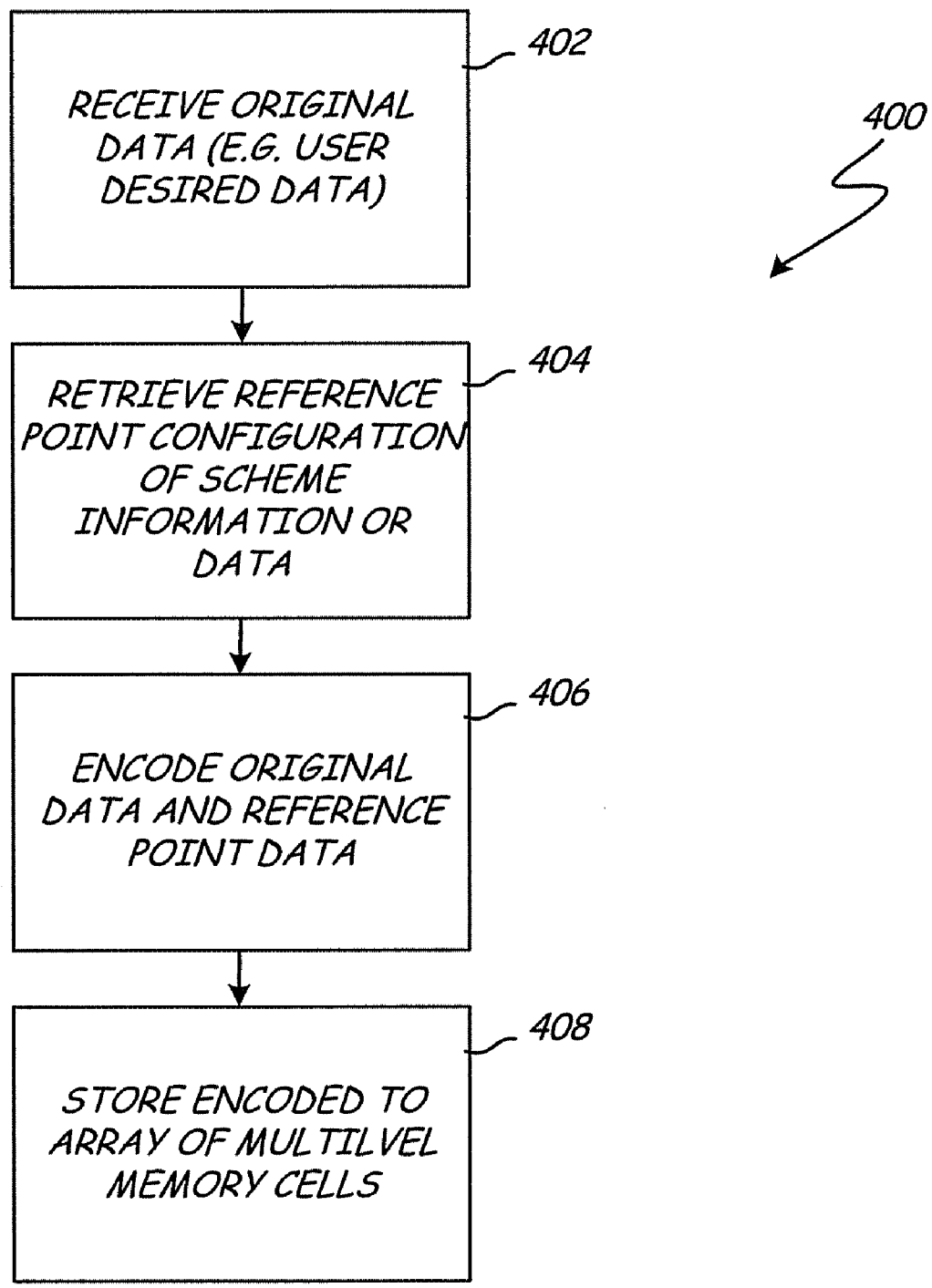
FIG. 4 is a flow diagram of a method of storing data to an array of multilevel memory cells.

FIG. 4 is a flow diagram of an illustrative method 400 of storing data to an array of multilevel memory cells. At block 402, a multilevel cell memory device receives raw user data. The raw user data is illustratively arbitrary data from an electronic device (such as device 350 in FIG. 3) that is intended to be stored in the MLC memory device.

At block 404, the MLC memory device retrieves reference point configuration or scheme information. The information is illustratively either retrieved from a location within the MLC memory device (i.e. retrieved from an internal source) or is illustratively retrieved from an external source. The reference point configurations or schemes illustratively correspond to various methods that have been previously described. For example, the scheme illustratively comprises including a certain number of reference point cells for every N cells, or the scheme illustratively comprises utilizing Trellis encoding/decoding or low density parity code that includes both maximum states and minimum states. Any method of utilizing reference point cells to determine states of cells is included in embodiments. Additional error correction code or parity information to be implemented is also illustratively retrieved.

At block 406, the raw user data is encoded utilizing the configuration or scheme retrieved at block 404. The encoded data illustratively includes one or more reference point cells that is later optionally used in determining the states of other cells. At block 408, the encoded data is written or otherwise stored to one or more arrays of multilevel cells.

Figure 5:
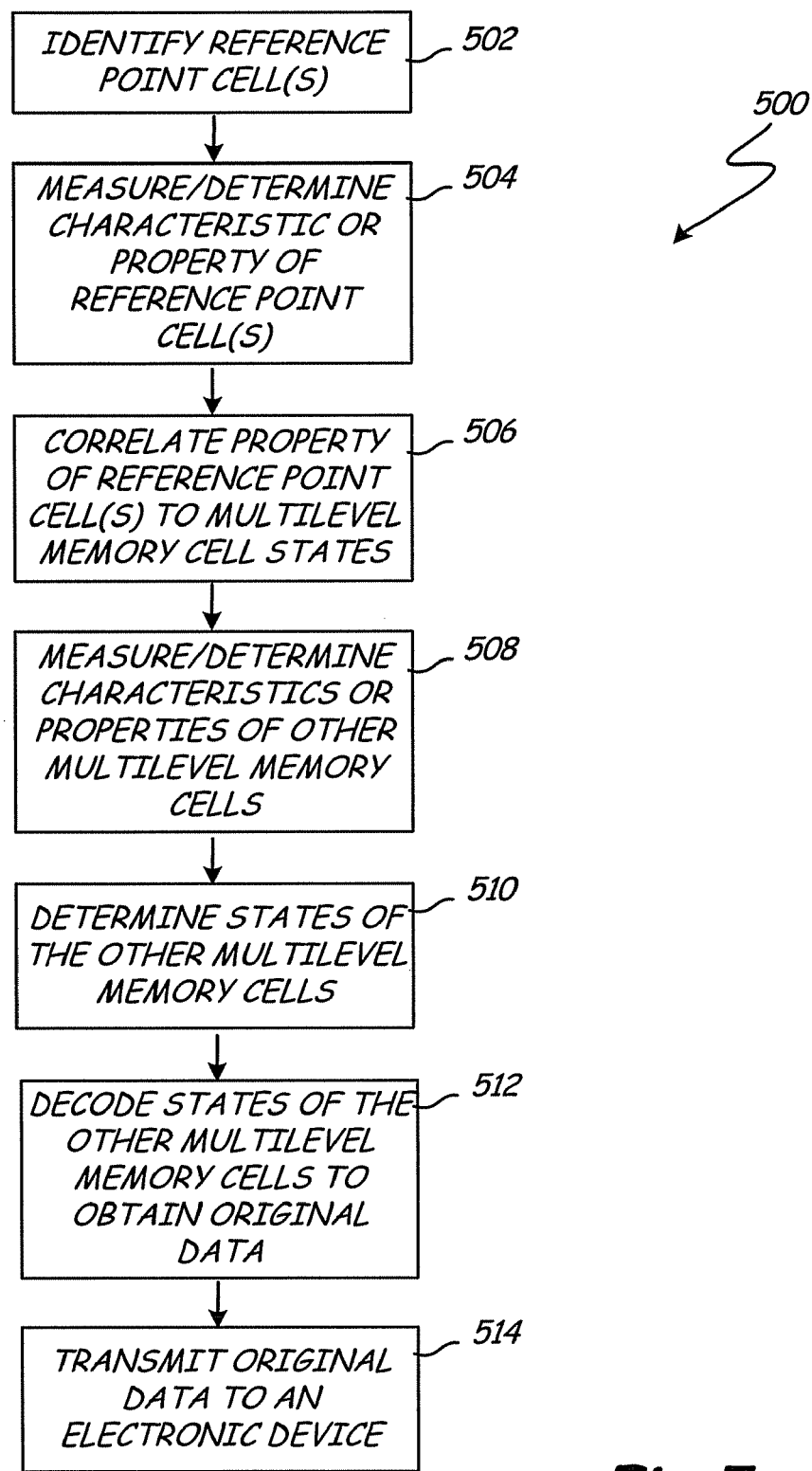
FIG. 5 is a flow diagram of a method of retrieving data from an array of multilevel memory cells.

FIG. 5 is a flow diagram of an illustrative method 500 of retrieving data from an array of multilevel memory cells. Method 500 is optionally used to retrieve data that was stored according to method 400. At block 502, the reference point cells are identified amongst a group of cells. In an embodiment, information about the reference point cell configuration used to encode the data is utilized. For example, the data is encoded to include reference point cells at the beginning or the ending of a group of N cells. The MLC memory device illustratively retrieves that information to determine or identify the reference point cells. Alternatively, the MLC memory device measures a characteristic or property of a group of memory cells and identifies the reference point cells based upon the measured characteristic or property. For example, the MLC memory device reads a current and determines that the reference point cells are the cells that are associated with the highest and lowest currents.

At block 504, a characteristic or property of the reference point cells is measured or otherwise determined. For example, a MLC memory device determines a voltage or resistivity of a reference point cell that has the maximum state and a voltage or resistivity of a reference point that has the minimum state.

At block 506, a characteristic or property of the reference point cell or cells is correlated to the multilevel memory cell states. For example, a MLC memory device correlates a property or characteristic (e.g. a voltage, resistivity, resistance, or current) to one or more multilevel memory states. For instance, a particular value of a property or characteristic (e.g. 5 volts) is determined to correspond to a particular state (e.g. the maximum state). In an embodiment, an affine transformation is used to correlate a property or characteristic of a cell to a particular memory cell state. In another embodiment, a set of reference points, such as but not limited to, center reference points and/or boundary reference points are calculated or determined that correlate a cell property or characteristic to a memory cell state. Alternatively, as has been previously described, one or more histograms are constructed for the reference point cells and are compared to one or more expected histograms.

At block 508, characteristics or properties of other multilevel memory cells (e.g. cells corresponding to or associated with user data) are measured or determined. For instance, a voltage, resistivity, resistance, current, magnetism, or optical transmittance/absorbance is measured for each cell.

At block 510, the states (e.g. first state/minimum state, second state, third state, fourth state/maximum state) of the other cells are determined based at least in part upon the information, data, or states from the reference point cells. For example, the gains, offsets, polynomial models, empirical models, histograms, affline transformations, non-linear models, boundary points, center points, other methods previously discussed, as well as any other methods or models are illustratively determined based upon the reference point cells and are applied or otherwise utilized to determine the states of the other cells.

At block 512, the states of the other cells are decoded to obtain the original user data. Information about the encoding scheme used to encode the data is illustratively retrieved and utilized to decode the data based upon the determined states of the cells. For example, the cells are encoded utilizing Trellis encoding and are decoded utilizing Trellis decoding.

At block 514, the decoded original data is transmitted or sent to a computing device. The computing device is illustratively the same computing device that originally transmitted the data to the MLC memory device or a different computing device.

The methods and devices described above do not rely solely on predetermined or fixed cell characteristics such as a fixed floating gate voltage value to determine the states of cells. Instead, reference point cells are utilized to determine the states of cells. This illustratively reduces or eliminates data loss or corruption based upon a characteristic or property of a cell drifting (e.g. a voltage level or resistivity level that decreases over time). Accordingly, at least certain embodiments of this disclosure improve data retention as compared to systems or methods that utilize predetermined or fixed reference points.

Finally, it is to be understood that even though numerous characteristics and advantages of various embodiments have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. In addition, although the embodiments described herein are directed to multilevel memory cell devices, it will be appreciated by those skilled in the art that the teachings of the disclosure can be applied to other types of data storage systems, without departing from the scope and spirit of the disclosure.

What is claimed is:

1. A multilevel cell memory device comprising:
   user data cells, each having one of a plurality of states;
   a first reference point cell having a first state;
   a second reference point cell having a second state; and
   a controller that determines the states of the user data cells utilizing a gain and an offset, the gain and the offset being based at least in part on the first state of the first reference point cell and on the second state of the second reference point cell.

2. The multilevel memory device of claim 1 wherein the user data cells are flash memory cells.

3. The multilevel memory device of claim 1 wherein the user data cells are phase change memory cells.

4. The multilevel memory device of claim 1 wherein the plurality of states includes the first state, the second state, a third state, and a fourth state.

5. The multilevel memory device of claim 1 wherein the plurality of states of the user data cells includes the first state, the second state, and one or more additional states, wherein the multilevel memory cell device includes one or more additional reference point cells having the one or more additional states, and wherein the controller determines the states of the user data cells based at least in part on the one or more additional states of the one or more additional reference point cells.

6. The multilevel memory device of claim 1 wherein the user data cells include the first and second reference point cells.

7. The multilevel memory device of claim 1 wherein the first and the second reference point cells are separate from the user data cells.

8. A multilevel cell memory device comprising:
   a plurality of cells that store user data by changing states; and
   a controller that determines the states of the plurality of cells utilizing a calculated value that is based at least in part on a measured property of a first one of the plurality of cells, the first cell being utilized in storing the user data.

9. The multilevel cell memory device of claim 8 wherein the states of the plurality of cells include a plurality of possible states, wherein the measured property is determined for each of the plurality of possible states, and wherein the calculated value is based at least in part on the measured properties of the plurality of possible states.

10. The multilevel cell memory device of claim 8 wherein the calculated value is determined utilizing a histogram.

11. The multilevel cell memory device of claim 8 wherein the calculated value is determined utilizing an affine transformation.

12. The multilevel cell memory device of claim 8 wherein the calculated value is a gain that is based at least in part on the measured property of the first cell.

13. The multilevel cell memory device of claim 8 wherein the calculated value is an offset that is based at least in part on the measured property of the first cell.

14. A method comprising:
  retrieving data stored to a multilevel cell memory device;
  identifying a reference point cell amongst a group of cells;
  measuring a property of the reference point cell;
  calculating a gain value utilizing the measured property of the reference point cell; and
  determining states of user data cells in the group of cells utilizing the gain value.

15. The method of claim 14 further comprising:
  decoding the states of the user data cells to obtain original user data.

16. The method of claim 15 wherein identifying the reference point cell comprises sampling the group of cells.

17. The method of claim 15 wherein identifying the reference point cell comprises retrieving information that indicates a location of the reference point cell.

18. The method of claim 15 wherein decoding comprises utilizing a data redundancy scheme.

19. The method of claim 14 further comprising:
  identifying additional reference point cells amongst the group of cells;
  measuring the property for each of the additional reference point cells; and
  wherein calculating the gain value further comprises utilizing the measured properties of the additional reference point cells.

* * * * *